US009666637B2

(12) United States Patent
Zivkovic et al.

(10) Patent No.: US 9,666,637 B2
(45) Date of Patent: May 30, 2017

(54) INTEGRATED SENSOR CHIP PACKAGE WITH DIRECTIONAL LIGHT SENSOR, APPARATUS INCLUDING SUCH A PACKAGE AND METHOD OF MANUFACTURING SUCH AN INTEGRATED SENSOR CHIP PACKAGE

(71) Applicant: NXP B.V., Eindhoven (NL)

(72) Inventors: Zoran Zivkovic, 's-Hertogenbosch (NL); Coenraad Cornelis Tak, Waalre (NL)

(73) Assignee: NXP B.V., Eindhoven (NL)

( * ) Notice: Subject to any disclaimer, the term of this patent is extended or adjusted under 35 U.S.C. 154(b) by 4 days.

(21) Appl. No.: 14/299,560

(22) Filed: Jun. 9, 2014

(65) Prior Publication Data

US 2014/0361394 A1     Dec. 11, 2014

(30) Foreign Application Priority Data

Jun. 10, 2013   (EP) ..................... 13171297

(51) Int. Cl.
*H01L 27/146* (2006.01)
*G01S 3/784* (2006.01)
(Continued)

(52) U.S. Cl.
CPC ........ *H01L 27/14687* (2013.01); *G01S 3/784* (2013.01); *H01L 27/14618* (2013.01);
(Continued)

(58) Field of Classification Search
CPC . H01L 27/14623; H01L 31/00–31/208; G01B 11/26; G01B 11/27; G01B 11/272
(Continued)

(56) References Cited

U.S. PATENT DOCUMENTS 4,785,338 A * 11/1988 Kinoshita ........... H01L 31/0232
                                              257/434
5,081,347 A *  1/1992 Matsumoto ............... G01J 1/04
                                              250/208.1
(Continued)

FOREIGN PATENT DOCUMENTS

CA    2 119 330 A1   9/1995
EP    1 189 072 A2   3/2002
(Continued)

OTHER PUBLICATIONS

Extended European Search Report for application No. 13171297.8 (Nov. 18, 2013).

*Primary Examiner* — Eric Ward

(57) ABSTRACT

Disclosed is an integrated sensor chip package comprising an integrated sensor chip enveloped in a packaging layer (30), the integrated circuit comprising a substrate (10) having a major surface; and a light sensor comprising a plurality of photodetectors (12a-d) on a region of said major surface; the packaging layer comprising an opening (32) exposing said region, the integrated sensor chip package further comprising a light blocking member (20) over said opening, the light blocking member defining an aperture (22) exposing a first set of photodetectors to light from a first range of directions and exposing a second set of photodetectors to light from a second range of directions, wherein the first range is different to the second range. An apparatus including such an integrated sensor chip package and a method of manufacturing such an integrated sensor chip package are also disclosed.

19 Claims, 5 Drawing Sheets

(51) Int. Cl.
*B01L 3/00* (2006.01)
*G01L 19/14* (2006.01)

(52) U.S. Cl.
CPC .. *H01L 27/14623* (2013.01); *H01L 27/14632* (2013.01); *H01L 27/14685* (2013.01); *B01L 3/502707* (2013.01); *G01L 19/141* (2013.01); *H01L 2924/0002* (2013.01)

(58) Field of Classification Search
USPC .......... 356/138–155, 141.1–141.5; 257/438; 438/64–67
See application file for complete search history.

(56) References Cited

U.S. PATENT DOCUMENTS

| | | | | |
|---|---|---|---|---|
| 5,264,691 | A * | 11/1993 | Hegyi | G01J 1/02 250/203.4 |
| 5,483,060 | A * | 1/1996 | Sugiura | G01J 1/04 250/203.4 |
| 5,534,725 | A * | 7/1996 | Hur | H01L 23/315 257/434 |
| 5,553,661 | A * | 9/1996 | Beyerlein | B60H 1/00735 165/11.1 |
| 5,644,169 | A * | 7/1997 | Chun | H01L 21/565 257/680 |
| 6,075,237 | A * | 6/2000 | Ciccarelli | H01L 31/0203 250/208.1 |
| 6,603,532 | B2 * | 8/2003 | Tsuji | G03F 7/70483 348/745 |
| 6,875,974 | B2 * | 4/2005 | Muesch | G01S 3/7835 250/203.1 |
| 6,924,540 | B2 * | 8/2005 | Shirakawa | G11B 7/13 257/434 |
| 7,145,253 | B1 * | 12/2006 | Kim | B81C 1/00333 257/417 |
| 7,535,071 | B2 * | 5/2009 | Schell | H01L 27/14618 250/203.5 |
| 2002/0053635 | A1 * | 5/2002 | Schroter | G01S 3/784 250/203.1 |
| 2005/0237415 | A1 | 10/2005 | Kong et al. | |
| 2007/0196103 | A1 * | 8/2007 | Cheng | G03B 17/02 396/529 |
| 2009/0134481 | A1 * | 5/2009 | Sengupta | B81C 1/00333 257/415 |
| 2011/0170105 | A1 | 7/2011 | Cui et al. | |
| 2011/0204209 | A1 * | 8/2011 | Barrows | G02B 27/58 250/208.1 |
| 2011/0248152 | A1 * | 10/2011 | Svajda | G01S 3/7803 250/221 |
| 2012/0211852 | A1 * | 8/2012 | Iwafuchi | H01L 27/14618 257/435 |
| 2013/0155396 | A1 * | 6/2013 | Deliwala | G01J 1/0242 356/138 |

FOREIGN PATENT DOCUMENTS

| | | |
|---|---|---|
| EP | 2662895 A1 | 11/2013 |
| FR | 2 601 443 A1 | 1/1998 |
| WO | 2009/087531 | 7/2009 |
| WO | 2011/058190 A1 | 5/2011 |

* cited by examiner

INTEGRATED SENSOR CHIP PACKAGE WITH DIRECTIONAL LIGHT SENSOR, APPARATUS INCLUDING SUCH A PACKAGE AND METHOD OF MANUFACTURING SUCH AN INTEGRATED SENSOR CHIP PACKAGE

CROSS-REFERENCE TO RELATED APPLICATIONS

This application claims the priority under 35 U.S.C. §119 of European patent application no. 13171297.8, filed on Jun. 10, 2013, the contents of which are incorporated by reference herein.

FIELD OF THE INVENTION

The present invention relates to an integrated sensor chip package comprising a substrate having a major surface; a light sensor, the light sensor comprising a plurality of photodetectors on a region of said major surface.

The present invention further relates to a device including such an integrated sensor chip package.

The present invention yet further relates to a method of manufacturing such an integrated sensor chip package.

BACKGROUND OF THE INVENTION

Nowadays, integrated sensors may comprise a plethora of different sensors, such as ambient light (AL) sensors, temperature (T) sensors, gas sensors, relative humidity (RH) sensors, integrated sensor chip analyte detection sensors, and so on.

Integrated sensors of this kind have a wide range of applications. For example, they can be used in the field of supply chain management to track and monitor the freshness of food and beverages. They can also be used as environmental sensors, for example as part of a heating, ventilation and air conditioning (HVAC) system in an automobile or in a building (e.g. a Smart Building). Additional applications include those in agricultural (e.g. the sensing of environmental conditions in greenhouses) or in medical fields. Their provision in mobile communications devices such as mobile telephones, tablets or laptops can also enable a wide range of further applications that require measurements of local environmental factors.

The provision of integrated sensor chips of this kind allows devices to be produced that have a small form factor, and which can be manufactured cheaply in large numbers using established semiconductor processing techniques.

There is a constant desire to diversify the sensor functionality integrated into an integrated sensor chip to add further functionality to an apparatus utilizing the integrated sensor chip. For instance, WO 2009/087531 by the present applicant discloses an integrated sensor chip having a light sensor that can detect both the intensity and direction of incident light, e.g. to compensate the output of a display device for ambient lighting conditions to improve the user experience of the display device. To this end, the light sensor comprises a dielectric layer, wherein the dielectric layer is substantially transparent to the incident light as well as a plurality of photo detectors coupled relative to the dielectric layer for detecting the incident light through the dielectric layer. A plurality of stacks of opaque slats embedded within the dielectric layer approximately parallel to an interface between the dielectric layer and the photo detectors is also present to define tapered light apertures between adjacent stacks of opaque slats.

Such a light sensor requires a relatively complex arrangement of tapered stacks of slats to make the light sensor directionally sensitive. There exists a need to simplify the design of such a light sensor.

SUMMARY OF THE INVENTION

The present invention seeks to provide an integrated sensor chip package according to the opening paragraph in which sensitivity to the directionality of incident light is provided in a more straightforward manner.

The present invention further seeks to provide an apparatus including such an integrated sensor chip package.

The present invention yet further seeks to provide a method of manufacturing such an integrated sensor chip package.

According to an aspect of the present invention, there is provided an integrated sensor chip package comprising an integrated sensor chip enveloped in a packaging layer, the integrated sensor chip comprising a substrate having a major surface; and a light sensor comprising a plurality of photodetectors on a region of said major surface; the packaging layer comprising an opening exposing said region, the integrated circuit package further comprising a light blocking member over said opening, the light blocking member defining an aperture exposing a first set of photodetectors to light from a first range of directions and exposing a second set of photodetectors to light from a second range of directions, wherein the first range is different to the second range.

The present invention is based on the insight that a light shielding portion that shades different parts of the light sensor under different angles can be accurately positioned and fitted relative to the package of the integrated sensor chip, thereby providing a straightforward and cost-effective integrated sensor chip including a light sensor that can be used to detect directionality, e.g. the orientation of an apparatus including the integrated sensor chip package.

In an embodiment, the light blocking member is a plate comprising said aperture. The plate may for instance be a metal plate made of any suitable metal such as aluminium. Such a light blocking member can be placed on the packaging layer in a straightforward manner, thus simplifying the manufacturing process.

The light blocking member preferably is adhered to the packaging layer for ease of manufacture.

In an embodiment, the packaging layer comprises a recessed surface portion, said opening being formed in said recessed surface portion, wherein the light blocking member is mounted on said recessed surface portion. This allows for the positioning of the light blocking member in close vicinity to the photodetectors, which allows for more effective angle-dependent shading of the photodetectors and a wide viewing angle of the light sensor.

The integrated sensor chip may further comprise a fluid sensor such as a gas sensor, wherein the opening further may define a fluidic channel providing fluidic access to the fluid sensor. This obviates the need for a separate access channel to a fluid sensor such as a gas sensor, thereby simplifying the design of such a multi-sensor IC.

In accordance with another aspect of the present invention, there is provided an apparatus comprising the integrated circuit package according to an embodiment of the present invention. Such an apparatus may for instance be one of a radio frequency identification tag; a mobile communications device; a display device; and a heating, ventilation and air-conditioning (HVAC) system, or any other device that can benefit from the inclusion of the integrated sensor chip package of the present invention.

In accordance with yet another aspect of the present invention, there is provided a method of manufacturing an integrated sensor chip package, the method comprising providing an integrated sensor comprising a semiconductor substrate having a major surface; providing a light sensor in the integrated sensor chip by forming a plurality of photodetectors on a region of the major surface; packaging the integrated sensor chip in a packaging layer; creating an opening in the packaging layer to expose said region; and placing a light blocking member over said opening, the light blocking member defining an aperture exposing a first set of photodetectors to light from a first range of directions and exposing a second set of photodetectors to light from a second range of directions, wherein the first range is different to the second range. This method thus provides a simple and cost-effective manner of forming a light sensor in a packaged integrated sensor chip that can be used to determine the directionality of the incident light.

The light blocking member may be fixed to the package layer in any suitable manner. In a particularly suitable embodiment, the step of placing said light blocking member over said opening comprises adhering the light blocking member to the packaging layer. This is a simple and cost-effective manner of fixing the light blocking member to the packaging layer.

In an embodiment, the method further comprises the step of forming a recessed surface portion in said packaging layer and wherein the step of forming said opening comprises forming said opening in the recessed surface portion; and the step of placing a light blocking member over said opening comprises mounting said light blocking member on said recessed surface portion. This allows for the placement of the light blocking member in close vicinity to the photodetectors, which increases the width of the viewing angle of the light sensor.

In an embodiment, the step of placing the light blocking member comprises optically aligning the light blocking member with said region. This ensures a highly accurate alignment of the light blocking member with the photodetectors, thus improving the accuracy of the light directional sensor.

The optically aligning step may comprise aligning the light blocking member with said region using a camera or alternatively may comprise exposing at least some of said photodetectors to a light source through said aperture; measuring the response of the at least some of said photodetectors; and aligning the light blocking member with said region in accordance with said response. The latter embodiment has the further advantage that the testing of the photodetectors may be combined with the alignment of the light blocking member in a single step, thus obviating the need for separate testing of the photodetectors.

BRIEF DESCRIPTION OF THE DRAWINGS

Embodiments of the invention are described in more detail and by way of non-limiting examples with reference to the accompanying drawings, wherein.

DETAILED DESCRIPTION OF THE EMBODIMENTS

Figure 1:
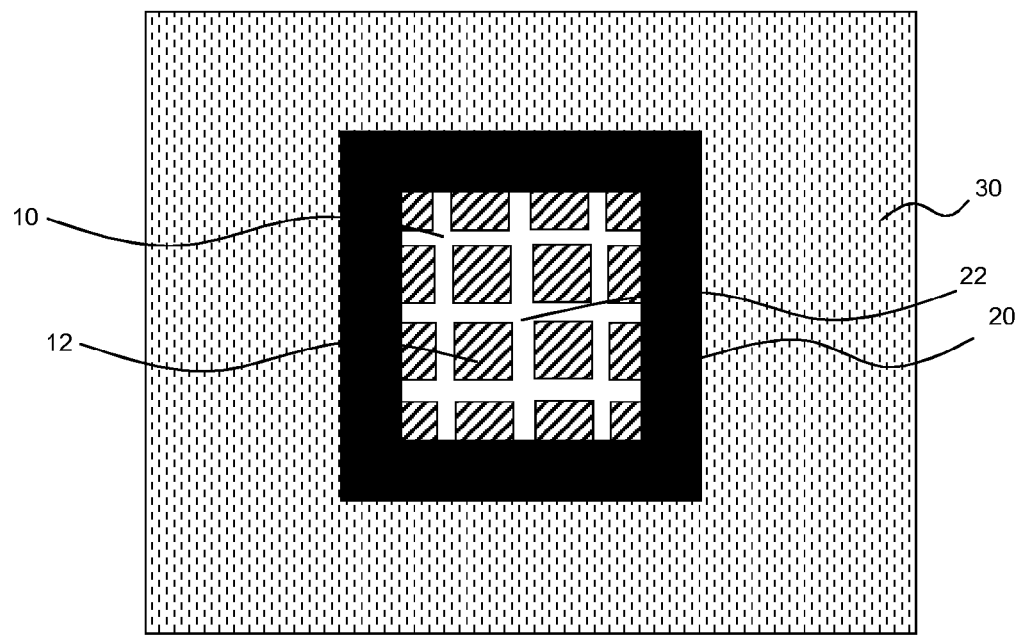
FIG. 1 schematically depicts a top view of an integrated sensor chip package according to an embodiment of the present invention.

It should be understood that the Figures are merely schematic and are not drawn to scale. It should also be understood that the same reference numerals are used throughout the Figures to indicate the same or similar parts.

Figure 2:
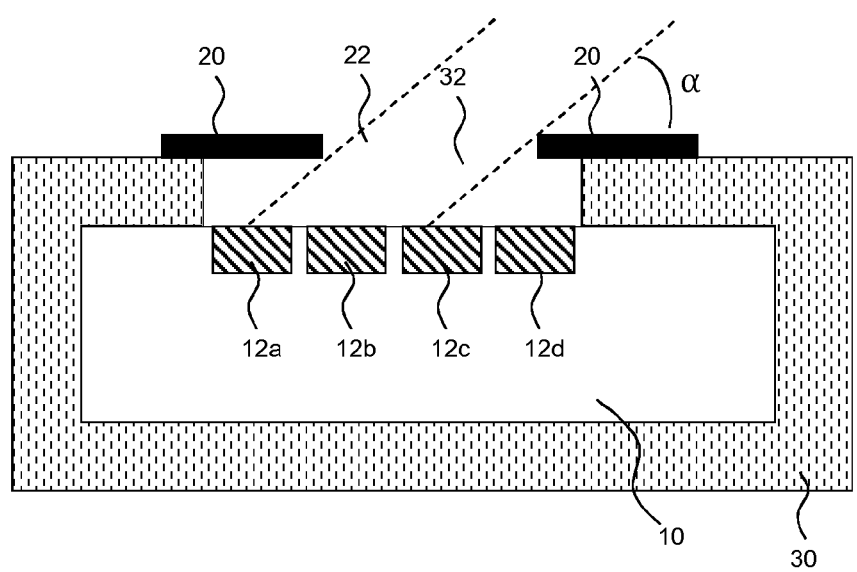
FIG. 2 schematically depicts a cross section of an integrated sensor chip package according to an embodiment of the present invention.

FIG. 1 schematically depicts a top view and FIG. 2 schematically depicts a cross section of an integrated sensor chip package according to an embodiment of the present invention. The integrated sensor chip package comprises a substrate 10, which may be any suitable substrate, e.g. a semiconductor substrate such as a silicon substrate, a silicon on insulator substrate, a silicon germanium substrate, and so on. The substrate 10 comprises a main surface having a region on which a plurality of photodetectors 12 is formed. In the context of the present application, 'formed on' is intended to at least include an embodiment in which the photodetectors 12 are formed on top of the main surface, an embodiment in which the photodetectors 12 are formed partially in the main surface and an embodiment in which the photodetectors 12 are formed embedded in the main surface 10a, i.e., sharing its photosensitive surface with the main surface of the substrate 10.

The photodetectors 12 form part of a light sensor, which may comprise a plurality of groups of photodetectors for determining the intensity and directionality of the incident light. For instance, the light sensor may comprise a grid of photodetectors 12, in which rows and/or columns of the photodetectors 12 of the grid are arranged to cooperate in the detection of light. FIGS. 1 and 2 schematically depict a 4×4 grid of photodetectors 12 by way of non-limiting example only. Any suitable grid size, e.g. comprising many more photodetectors 12 may be contemplated.

In FIGS. 1 and 2, the photodetectors 12 are laterally separated from each other by way of non-limiting example only. It is equally feasible that the areas of the respective photodetectors 12 contact each other. It should be understood that any suitable layout of the photodetectors 12 of the light sensor may be contemplated, e.g. regular or irregular grids, a central photodetector surrounded by peripheral photodetector and so on. It should also be understood that different photodetectors 12 may have different sizes, i.e. different size photosensitive areas. For instance, a light sensor may comprise a central photodetector 12 that is larger than the peripheral photodetectors 12. Each individual photodetector 12 on the main surface of the substrate 10 may have a photosensitive area of several tens of microns squared, e.g. 100 microns×100 microns, to increase the sensitivity of the photodetector.

The substrate or sensor chip 10 is typically packaged in a packaging layer 30 comprising an opening 32 to expose the photodetectors 12 on the substrate 10. Chip packaging is known per se and will not be explained in further detail for the sake of brevity. It should be understood that any suitable chip packaging material, e.g. a resin such as an epoxy resin, premolded packaging, a metal package such as a metal can and so on, may be used for the packaging layer 30. The opening 32 in the packaging layer 30 may be formed in any suitable manner, e.g. etching, laser cutting, stamping and the like. Alternatively, in case of the packaging layer 30 comprising a resin, the opening 32 may be formed by pressing an insert into the packaging layer 30 during the molding process and removing the insert after curing of the packaging layer 30.

The integrated sensor chip package according to embodiments of the present invention further comprises at least one light blocking member 20 placed on the packaging layer 30. The light blocking member 20 is made of an opaque material such as a metal and is used to prevent exposure of some of the photodetectors 12a-d to incident light of certain angles of incidence, as is shown in FIG. 2. In an embodiment, the light blocking member 20 is a metal plate or a plate of another suitable opaque material. The light blocking member 20 defines an aperture 22 through which subsets of the photodetectors 12 may be exposed to incident light depending on the angle of incidence of the light. In FIG. 1, the aperture 22 has a square shape by way of non-limiting example only. It should be understood that the aperture 22 may have any suitable shape.

As can be seen in FIGS. 1 and 2, the light blocking structure 20 at least partially overhangs or shades some of the photodetectors 12, such that only some of the photodetectors 12 are exposed to light at a certain angle of incidence. This is schematically depicted in FIG. 2 by the dashed lines indicating light passing through the aperture 22 under an angle α such that photodetectors 12a and 12c are only partially exposed to the incident light, whilst photodetector 12b is fully exposed and photodetector 12d is not exposed at all to incident light of angle α.

Consequently, when the integrated sensor chip package is exposed to light from a first direction, e.g. having an angle of incidence a, the photodetector 12b will produce a stronger photo-induced signal than the photodetectors 12a and 12c, and photodetector 12d will produce no more than a negligible signal, e.g. caused by incident scattered light. Different angles of incidence will expose a different subset of the photodetectors 12 to such incident light, such that each angle of incidence can be correlated to a unique signal combination in terms of signal intensity and originating photodetector 12. These signatures can be identified by a signal processor (not shown) to detect the orientation of the integrated sensor chip package relative to this angle of incidence. Such a signal processor may be provided on the integrated sensor chip or on a separate chip in the package. The intensity of the signals can furthermore be used to derive the intensity of the incident light as is well known per se.

Because the light blocking member 20 is positioned on the finalized integrated sensor chip package, the light blocking member 20 can be accurately positioned relative to the photodetectors 12 as will be explained in more detail later. It is pointed out that this is an important advantage over prior art arrangements in which the light blocking members were integrated in the chip package as manufacturing tolerances in chip packaging of typically about 100 micron tend to prohibit accurate alignment of the light blocking member 20 with the region of the substrate 10 carrying the photodetectors 12. Such tolerances for instance cannot be avoided in cavity molding processes, in which the integrated sensor chip is moulded into the packaging layer 30 at elevated temperatures, which introduces a level of uncertainty about the precise position of the integrated sensor chip in the packaging layer 30.

The light blocking member 20 may be affixed to the packaging layer 30 in any suitable manner. In an embodiment, the light blocking member 20 is affixed to the packaging layer 30 using an adhesive, i.e. glue.

Figure 3:
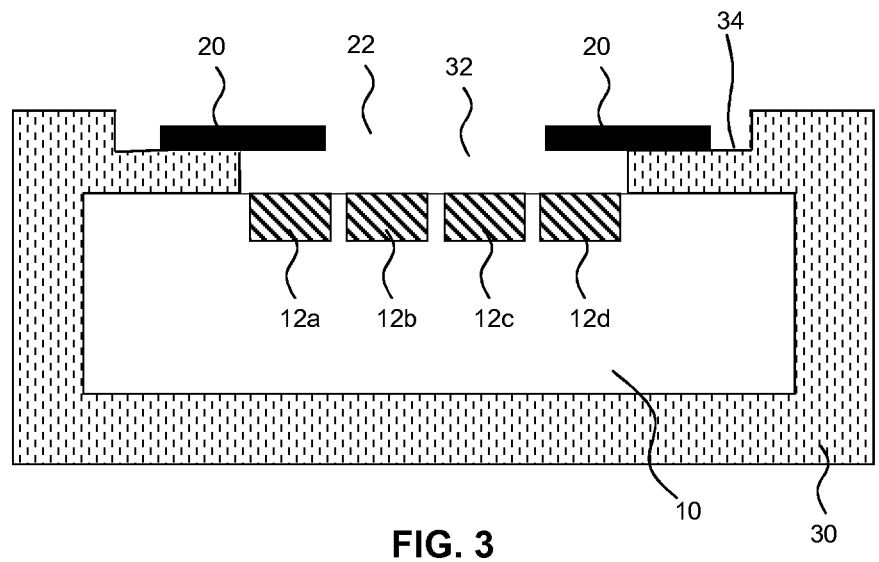
FIG. 3 schematically depicts a cross section of an integrated sensor chip package according to another embodiment of the present invention.

FIG. 3 schematically depicts a cross section of another embodiment of an integrated sensor chip package according to the present invention. The integrated sensor chip package of FIG. 3 shares many elements of the integrated sensor chip package of FIG. 1. Such shared features are identified using the same reference numerals and will not be explained in detail again for the sake of brevity. In FIG. 3, the surface of the packaging layer 30 in which the opening 32 is formed to expose the photodetectors 12 comprises a recessed surface portion 34, with the opening 32 being formed the said recessed surface portion 34. In other words, the surface of the packaging layer 30 in which the opening 32 is formed has a stepped profile. The light blocking member 20 is mounted on the recessed surface portion 34, e.g. by using an adhesive. This brings the light blocking member 20 in closer vicinity to the region of the substrate 10 carrying the photodetectors 12, which increases the viewing angle of the light directional sensor. Hence, this embodiment is particularly suitable for providing an integrated sensor chip package comprising a wide-angle light directional sensor.

Figure 4:
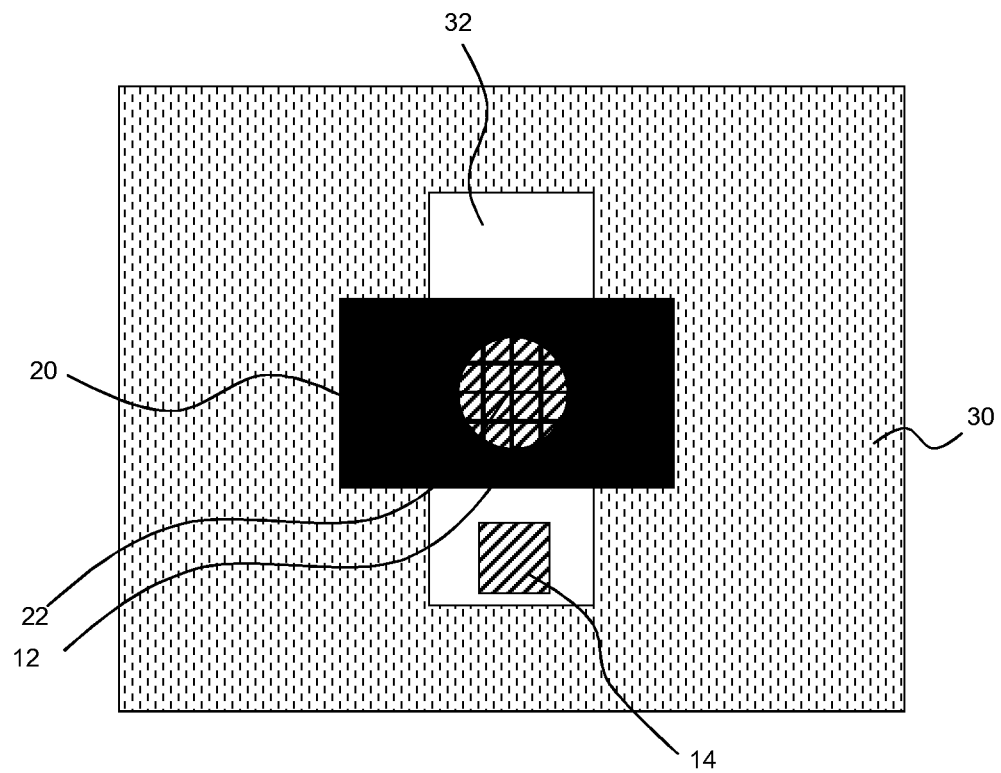
FIG. 4 schematically depicts a top view of an integrated sensor chip package according to another embodiment of the present invention.

As previously explained, ICs can contain a wide variety of sensors. A particularly interesting class of sensors is fluid sensors, e.g. gas or moisture sensors, relative humidity sensors, and so on. Such sensors must be exposed to the environment of the integrated sensor chip package, i.e. the integrated sensor chip package must contain an opening to expose such a fluid sensor to its environment. FIG. 4 schematically depicts a top view of an integrated sensor chip package comprising an opening 32 acting as a fluid channel for a fluid sensor 14 on the IC, e.g. on the main surface of the substrate 10, on top of the metallization stack of the integrated sensor chip and so on.

The photodetectors 12 are also exposed by the opening 32 acting as a fluid channel. The light blocking member 20 is located over the opening 32 and may cooperate with the opening 32 to define the fluid channel. The aperture 22 partially exposes the photodetectors 12 as previously explained. The aperture 22 is a circular aperture in FIG. 4 by way of non-limiting example, simply to show that different shapes of apertures 22 may be used for the light blocking member 20.

Figure 5:
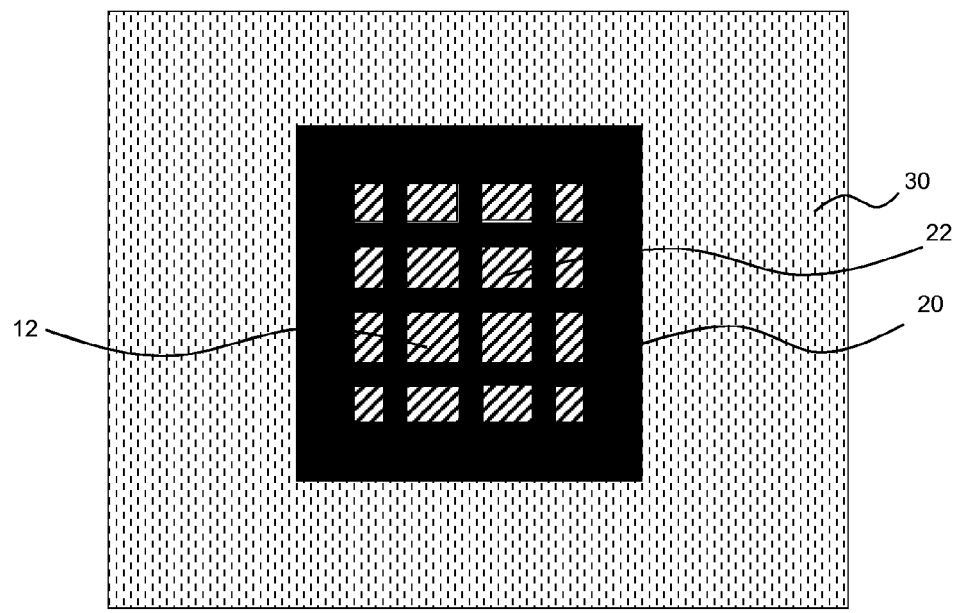
FIG. 5 schematically depicts a top view of an integrated sensor chip package according to yet another embodiment of the present invention.
Figure 6:
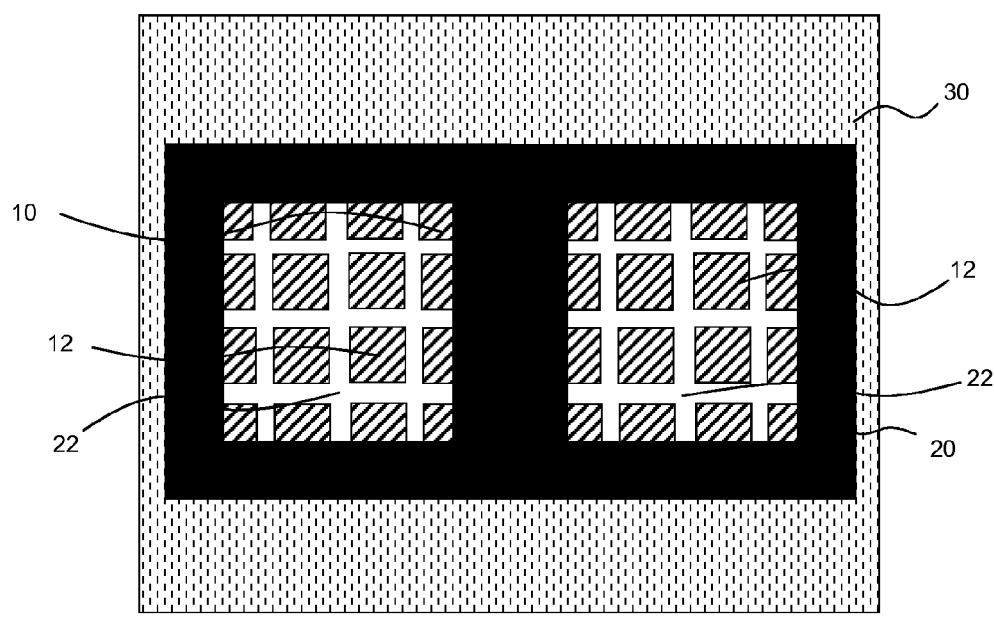
FIG. 6 schematically depicts a top view of an integrated sensor chip package according to yet another embodiment of the present invention.

It is noted at this point that the light blocking member may comprise a single aperture 22 or multiple apertures 22 over a single region of photodetectors 12, as is shown in FIG. 5. This embodiment can be used to provide a more fine-grained shading pattern over the photodetectors 12. The multiple apertures 22 may have any suitable shape, e.g. circular, oval, square, oblong shapes and so on. Alternatively, the sensor chip may comprise a substrate 10 comprising a plurality of light-sensitive regions, each region comprising a separate plurality of photodetectors 12, wherein the light blocking member 20 comprises multiple apertures 22 such that each aperture 22 provides shading to one of said light-sensitive regions. This is shown in FIG. 6.

The integrated sensor chip package according to embodiments of the present invention may be integrated in a suitable apparatus. For example, the apparatus may be a Radio Frequency Identification (RFID) tag, a mobile communications device, examples of which include mobile telephones, tablets and laptops. The apparatus alternatively may be a heating, ventilation and air conditioning (HVAC) system. The HVAC system can, for example, be provided in an automobile or in a building (e.g. a Smart Building).

The apparatus may be a display device, in which case the light sensor of the integrated sensor chip may be used to provide information about the directionality of incident ambient light, which information may be used to adjust e.g. the brightness of (parts of) the image displayed on the display device to compensate for the incident light. Other applications can include use in the field of supply chain management to track and monitor the freshness of food and beverages. Additional applications include those in agricultural (e.g. the sensing of environmental conditions in greenhouses) or in medical fields.

The integrated sensor chip package according to embodiments of the present invention may be manufactured in any suitable manner. In particular, the manufacturing of an integrated sensor chip comprising a plurality of photodetectors 12 and the packaging of such an integrated sensor chip in a packaging layer 30, e.g. through a cavity molding process, is well-known per se such that this will not be explained in further detail for the sake of brevity only.

Figure 7:
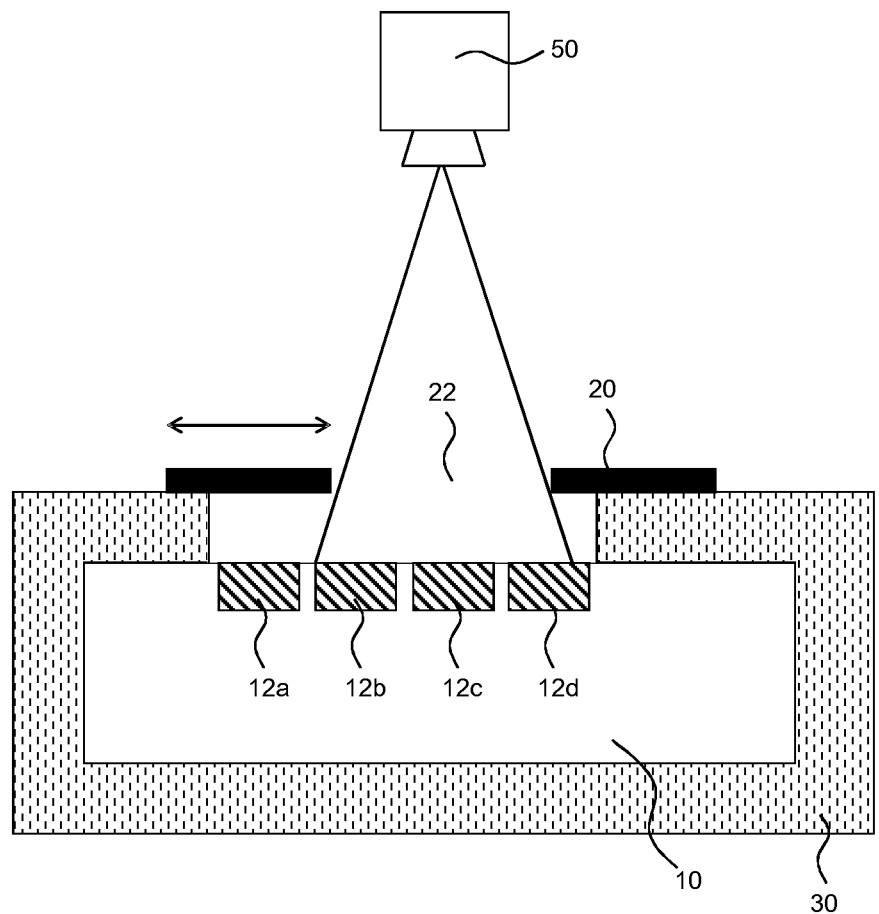
FIG. 7 schematically depicts an aspect of an integrated sensor chip package manufacturing method according to an embodiment of the present invention.

FIG. 7 schematically depicts an aspect of such a manufacturing step in which the light blocking member 20 is aligned over the opening 32 in the packaging layer with the aid of optical tools, here a camera 50. The camera 50 is used to identify features on the part of the surface of the substrate 10 that is exposed through the aperture 22, such as the borders of the underlying photodetectors 12a-d, some markers of the substrate 10 or combinations thereof, and to provide feedback to a mechanical placement tool (not shown) responsible for the placement of the light blocking member 20 over the opening 32. This feedback mechanism can be used to accurately align the light blocking member 20 with the photodetectors 12a-d.

Figure 8:
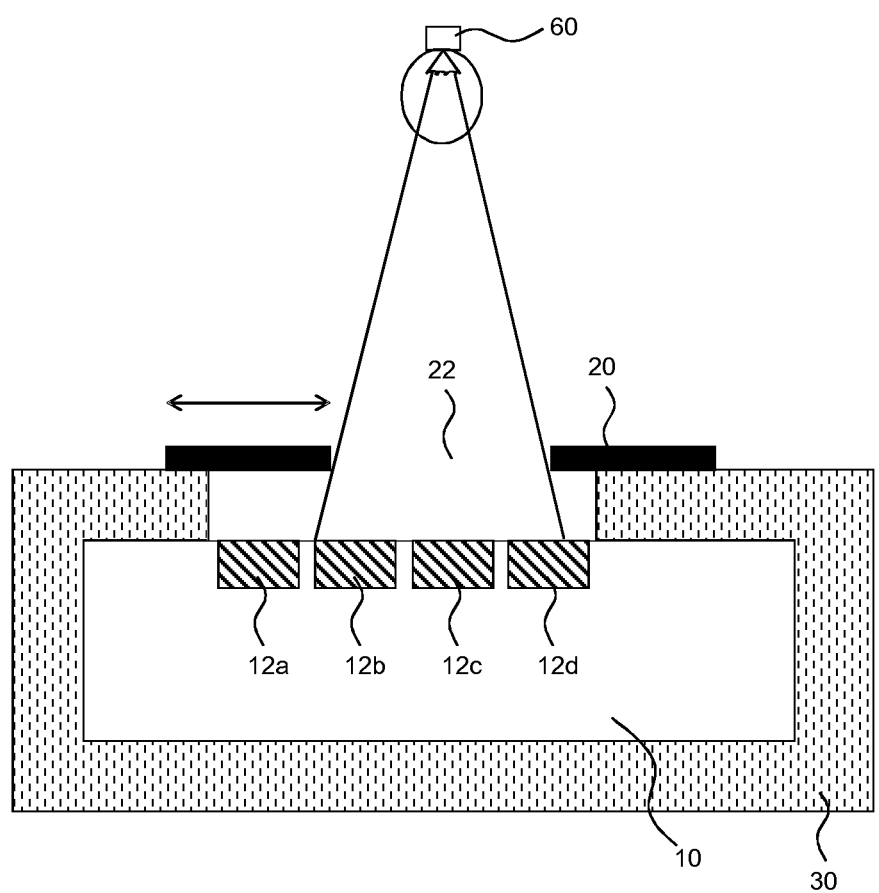
FIG. 8 schematically depicts an aspect of an integrated sensor chip package manufacturing method according to another embodiment of the present invention.

FIG. 8 schematically depicts an alternative aspect of such a manufacturing step in which the light blocking member 20 is aligned over the opening 32 in the packaging layer with the aid of optical tools, here a light source 60. In this embodiment, the photodetectors 12a-d are used to detect the light from the light source 60, such that the response from the photodetectors 12a-d is used as the feedback for the mechanical placement tool responsible for aligning the light blocking member 20 with the photodetectors 12a-d. For instance, the light blocking member 20 can be assumed to be in its intended position when the grid of photodetectors 12 produces a balanced or symmetrical output profile. This embodiment has the further benefit that the photodetectors 12a-d may be tested at the same time to detect malfunctioning photodetectors 12a-d.

An adhesive may be present on the upper surface of the packaging layer 30, i.e. the surface receiving the light blocking member 20 and/or on the surface of the light blocking member 20 to be adhered to the packaging layer 30. This adhesive may be developed once the alignment of the light blocking member 20 relative to the photodetectors 12a-d has been completed, e.g. by drying or curing the adhesive.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. An integrated sensor chip package comprising
an integrated circuit enveloped in a packaging layer,
the integrated circuit including:
a substrate having a major surface; and
a light sensor including a plurality of photodetectors on a region of said major surface;
the packaging layer including an opening exposing said region,
the package further comprising
a light blocking member over the opening,
the light blocking member defining an aperture
exposing a first set of photodetectors to light from a first range of directions and
exposing a second set of photodetectors to light from a second range of directions,
wherein the first range is different to the second range; and
wherein the integrated circuit further comprises a fluid or gas sensor, wherein the opening cooperates with the light blocking member to define a fluidic or gas channel providing fluidic or gas access to the fluid or gas sensor.

2. The integrated sensor chip package of claim 1, wherein the light blocking member is a plate comprising said aperture.

3. The integrated sensor chip package of claim 2, wherein the plate is a metal plate.

4. The integrated sensor chip package of claim 1, wherein the light blocking member is adhered to the packaging layer.

5. The integrated sensor chip package of claim 1, wherein the packaging layer comprises a recessed surface portion, said opening being formed in said recessed surface portion, wherein the light blocking member is mounted on said recessed surface portion.

6. An apparatus comprising the integrated sensor chip package of claim 1.

7. The apparatus of claim 6, wherein the apparatus is one of:
a mobile communications device;
and
a heating, ventilation and air-conditioning (HVAC) system.

8. The integrated sensor chip package of claim 1:
wherein the light blocking member includes lateral dimensions smaller than lateral dimensions of the integrated circuit.

9. The integrated sensor chip package of claim 1:
wherein the continuous packaging layer surrounds the integrated circuit.

10. The integrated sensor chip package of claim 1:
wherein the packaging layer is an encapsulation compound; and
wherein the opening corresponds to an insert removed after encapsulation.

11. The integrated sensor chip package of claim 1:
wherein the opening in the packaging layer is configured to expose said region to an environment external to the package.

12. The integrated sensor chip package of claim 1:
wherein the opening is configured to be formed using at least one of: etching, laser cutting, stamping, or removing an insert.

13. A method of manufacturing an integrated sensor chip package, the method comprising:
providing an integrated sensor chip comprising a fluid or gas sensor and a semiconductor substrate having a major surface;
providing a light sensor in the integrated sensor chip by forming a plurality of photodetectors on a region of the major surface;
packaging the integrated sensor chip in a packaging layer;
creating an opening in the packaging layer to expose said region; and
placing a light blocking member over said opening, the light blocking member defining an aperture exposing a first set of photodetectors to light from a first range of directions and exposing a second set of photodetectors to light from a second range of directions, wherein the first range is different to the second range; and
wherein the opening cooperates with the light blocking member to define a fluidic or gas channel providing fluidic or gas access to the fluid or gas sensor.

14. The method of claim 13, wherein the step of placing said light blocking member over said opening comprises adhering the light blocking member to the packaging layer.

15. The method of claim 13, wherein the light blocking member is a plate comprising said aperture.

16. The method of claim 13, further comprising the step of forming a recessed surface portion in said packaging layer and wherein:
the step of forming said opening comprises forming said opening in the recessed surface portion; and
the step of placing a light blocking member over said opening comprises mounting said light blocking member on said recessed surface portion.

17. The method of claim 13, wherein the step of placing the light blocking member comprises optically aligning the light blocking member with said region.

18. The method of claim 17, wherein said optically aligning step comprises aligning the light blocking member with said region using a camera.

19. The method of claim 17, wherein said optically aligning step comprises:
exposing at least some of said photodetectors to a light source through said aperture;
measuring the response of the at least some of said photodetectors; and
aligning the light blocking member with said region in accordance with said response.

* * * * *